United States Patent
Kirihara (10) Patent No.: US 10,573,559 B2
(45) Date of Patent: Feb. 25, 2020

(54) LASER PROCESSING METHOD FOR WAFER

(71) Applicant: DISCO CORPORATION, Tokyo (JP)

(72) Inventor: Naotoshi Kirihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/195,190

(22) Filed: Nov. 19, 2018

(65) Prior Publication Data

US 2019/0164833 A1    May 30, 2019

(30) Foreign Application Priority Data

Nov. 30, 2017    (JP) ................................ 2017-230283

(51) Int. Cl.

| H01L 21/301 | (2006.01) |
| H01L 21/78 | (2006.01) |
| H01L 21/268 | (2006.01) |
| H01L 21/67 | (2006.01) |
| B23K 26/53 | (2014.01) |
| B23K 26/0622 | (2014.01) |
| B23K 26/06 | (2014.01) |
| B23K 26/08 | (2014.01) |

(Continued)

(52) U.S. Cl.
CPC .......... *H01L 21/78* (2013.01); *B23K 26/0006* (2013.01); *B23K 26/0622* (2015.10); *B23K 26/0624* (2015.10); *B23K 26/0626* (2013.01); *B23K 26/0876* (2013.01); *B23K 26/386* (2013.01); *B23K 26/53* (2015.10); *H01L 21/268* (2013.01); *H01L 21/67253* (2013.01); *H01L 22/12* (2013.01); *B23K 2101/40* (2018.08); *B23K 2103/56* (2018.08); *H01L 21/67092* (2013.01)

(58) Field of Classification Search
None
See application file for complete search history.

(56) References Cited

U.S. PATENT DOCUMENTS

| 5,893,990 A * | 4/1999 | Tanaka ............... B23K 26/0738 |
| | | 219/121.8 |
| 7,364,952 B2 * | 4/2008 | Im ..................... B23K 26/0604 |
| | | 438/150 |

(Continued)

FOREIGN PATENT DOCUMENTS

| JP | 2005129607 A | 5/2005 |
| JP | 2014221483 A | 11/2014 |

*Primary Examiner* — Ali Naraghi
(74) *Attorney, Agent, or Firm* — Greer Burns & Crain Ltd.

(57) ABSTRACT

A laser processing method for a wafer includes: linearly forming a plurality of shield tunnels each having a fine hole and an amorphous region surrounding the fine hole at predetermined intervals in an inner part of a test substrate, the test substrate having a material and a thickness identical to those of a substrate of the wafer to be processed, while changing time intervals of a plurality of pulses constituting a burst pulse laser beam; and measuring a rupture strength when the test substrate is ruptured along the plurality of shield tunnels. Next, the time intervals of the pulses when the rupture strength is at a minimum are calculated, and a laser processing step is performed which linearly forms a plurality of shield tunnels at predetermined intervals in an inner part of the wafer, by irradiating the wafer with the laser beam having the time intervals of the pulses.

2 Claims, 10 Drawing Sheets

(51) Int. Cl.
*B23K 26/386* (2014.01)
*H01L 21/66* (2006.01)
*B23K 26/00* (2014.01)
B23K 103/00 (2006.01)
B23K 101/40 (2006.01)

(56) References Cited

U.S. PATENT DOCUMENTS

| | | | | |
|---|---|---|---|---|
| 7,759,230 B2* | 7/2010 | Im | ............... | B23K 26/0676 |
| | | | | 438/486 |
| 2005/0095817 A1* | 5/2005 | Nagai | ............ | H01L 21/3043 |
| | | | | 438/462 |
| 2014/0038392 A1* | 2/2014 | Yonehara | ......... | H01L 21/304 |
| | | | | 438/463 |
| 2014/0213043 A1* | 7/2014 | Van der Stam | .... | B23K 26/0006 |
| | | | | 438/463 |
| 2017/0186656 A1* | 6/2017 | Iwamoto | ........... | H01L 21/268 |
| 2018/0345418 A1* | 12/2018 | Lei | ............... | H01L 21/6836 |

* cited by examiner

LASER PROCESSING METHOD FOR WAFER

BACKGROUND OF THE INVENTION

Field of the Invention

The present invention relates to a laser processing method for a wafer such as an optical device wafer or the like.

Description of the Related Art

A cutting apparatus referred to as a dicing saw has been used to divide a wafer into each individual device chip in the past. It is difficult, however, to cut a hard brittle material such as sapphire, SiC, or the like serving as a substrate for crystal growth (epitaxy substrate) of an optical device wafer or the like by a dicing saw. Therefore, in recent years, attention has been focused on a technology of dividing a wafer into a plurality of device chips by laser processing using a laser processing apparatus.

As one of laser processing methods using the laser processing apparatus, a technology is disclosed in Japanese Patent Laid-Open No. 2005-129607, for example, in which a modified layer is formed within a wafer by using a pulsed laser beam of a wavelength transmissible through the wafer, and the wafer is divided into a plurality of device chips by applying an external force to the wafer by an expanding apparatus or the like along the modified layer in which strength is decreased.

However, the stealth dicing (SD) processing method that forms the modified layer within the wafer by applying a pulsed laser beam of a wavelength transmissible through the wafer needs to apply the pulsed laser beam to one dividing line a plurality of times. There is thus a desire for a further improvement in productivity.

Accordingly, Japanese Patent No. 6151557 describes a processing method that irradiates a wafer formed of a single crystal substrate such as a sapphire substrate, a SiC substrate, or the like with a pulsed laser beam of a wavelength transmissible through the substrate by using a condensing lens having a relatively small numerical aperture, thereby linearly and intermittently forms a plurality of shield tunnels each constituted of a fine hole and an amorphous region shielding the fine hole within the substrate, and thereafter divides the wafer into each individual device chip by applying an external force to the wafer.

SUMMARY OF THE INVENTION

However, because a laser processing method described in Japanese Patent No. 6151557 linearly and intermittently forms a plurality of shield tunnels each constituted of a fine hole and an amorphous region shielding the fine hole along planned dividing lines within the wafer, it is desirable to use, as the pulsed laser beam to be applied, a burst pulse laser beam that applies a plurality of pulses intermittently at intervals of a predetermined stop time.

However, in the laser processing method in the past that forms the plurality of shield tunnels within the wafer, sufficient verification has not been performed with respect to the time intervals of the plurality of pulses constituting the burst pulse laser beam. The time intervals of the plurality of pulses constituting the burst pulse laser beam are set at time intervals that seem to be best time intervals from past experiences, and laser processing of the wafer is performed by applying the burst pulse laser beam having the time intervals. There is thus a problem in a splitting property at a time of dividing the wafer into each individual device chip.

It is accordingly an object of the present invention to provide a laser processing method for a wafer, in which laser processing conditions of a pulsed laser beam most suitable for division are found before laser processing of the wafer, and the laser processing is performed on the wafer under the laser processing conditions.

In accordance with an aspect of the present invention, there is provided a laser processing method for a wafer in which an epitaxial layer is laminated to a top surface of a substrate, and a device is formed in each of regions demarcated by a plurality of intersecting planned dividing lines on a top surface of the epitaxial layer, the laser processing method including: a pulse thinning-out step of thinning out pulses of a pulsed laser beam of a wavelength transmissible through the wafer, the pulsed laser beam being oscillated from a laser oscillator, by first thinning-out means at first predetermined intervals; an amplifying step of amplifying the pulsed laser beam after the pulse thinning-out step is performed; a burst pulse laser beam generating step of generating a burst pulse laser beam by continuously and intermittently thinning out the pulsed laser beam amplified in the amplifying step by second thinning-out means at second predetermined intervals; a test substrate preparing step of preparing a test substrate having a material and a thickness identical to a material and a thickness of the substrate of the wafer; a shield tunnel forming step of linearly forming a plurality of shield tunnels each constituted of a fine hole and an amorphous region surrounding the fine hole at predetermined intervals within the test substrate by holding the test substrate by a chuck table of a laser processing apparatus, irradiating the test substrate with the burst pulse laser beam while positioning a condensed region of the burst pulse laser beam within the test substrate, and processing-feeding the chuck table, while changing time intervals of a plurality of pulses constituting the burst pulse laser beam; a rupture strength measuring step of measuring a rupture strength when the test substrate is ruptured along the plurality of shield tunnels after the shield tunnel forming step is performed; a minimum value calculating step of calculating the time intervals of the pulses that minimize the rupture strength of the test substrate after the rupture strength measuring step is performed a plurality of times while changing the time intervals of the plurality of pulses constituting the burst pulse laser beam; and a laser processing step of linearly forming a plurality of shield tunnels each constituted of a fine hole and an amorphous region surrounding the fine hole at predetermined intervals in an inner part of the wafer, the inner part corresponding to a planned dividing line, by holding the wafer by the chuck table of the laser processing apparatus, irradiating the wafer with the burst pulse laser beam while positioning the condensed region of the burst pulse laser beam having the calculated time intervals of the pulses, the calculated time intervals being calculated in the minimum value calculating step, in the inner part of the wafer, the inner part corresponding to the planned dividing line, and processing-feeding the chuck table, after the minimum value calculating step is performed.

In accordance with another aspect of the present invention, there is provided a laser processing method for a wafer in which an epitaxial layer is laminated to a top surface of a substrate, and a device is formed in each of regions demarcated by a plurality of intersecting planned dividing lines on a top surface of the epitaxial layer, the laser processing method including: an amplifying step of amplifying a pulsed laser beam of a wavelength transmissible through the wafer, the pulsed laser beam being oscillated from a laser oscillator; a burst pulse laser beam generating step of generating a burst pulse laser beam by continuously and intermittently thinning out the pulsed laser beam amplified in the amplifying step by thinning-out means at predetermined intervals; a test substrate preparing step of preparing a test substrate having a material and a thickness identical to a material and a thickness of the substrate of the wafer; a shield tunnel forming step of linearly forming a plurality of shield tunnels each constituted of a fine hole and an amorphous region surrounding the fine hole at predetermined intervals within the test substrate by holding the test substrate by a chuck table of a laser processing apparatus, irradiating the test substrate with the burst pulse laser beam while positioning a condensed region of the burst pulse laser beam within the test substrate, and processing-feeding the chuck table; a rupture strength measuring step of measuring a rupture strength when the test substrate is ruptured along the plurality of shield tunnels after the shield tunnel forming step is performed; a minimum value calculating step of, after the rupture strength measuring step is performed a plurality of times while changing time intervals of a plurality of pulses constituting the burst pulse laser beam, calculating the time intervals of the pulses that minimize the rupture strength of the test substrate; and a laser processing step of linearly forming a plurality of shield tunnels each constituted of a fine hole and an amorphous region surrounding the fine hole at predetermined intervals in an inner part of the wafer, the inner part corresponding to a planned dividing line, by holding the wafer by the chuck table of the laser processing apparatus, irradiating the wafer with the burst pulse laser beam while positioning the condensed region of the burst pulse laser beam in the inner part of the wafer, the inner part corresponding to the planned dividing line, using the laser oscillator oscillating pulses having the time intervals calculated in the minimum value calculating step, and processing-feeding the chuck table, after the minimum value calculating step is performed.

The laser processing method according to the present invention uses a test substrate having a material and a thickness identical to those of the substrate of a wafer to be processed, performs the shield tunnel forming step while changing the time intervals of a plurality of pulses constituting a burst pulse laser beam applied to the test substrate, thereafter calculates the time intervals of the pulses that minimize the rupture strength of the test substrate, and performs the laser processing step of forming a plurality of shield tunnels each constituted of a fine hole and an amorphous region surrounding the fine hole in an inner part of the wafer, the inner part corresponding to a planned dividing line of the wafer for processing, by irradiating the wafer for processing with the burst pulse laser beam having the calculated time intervals of the pulses. Therefore, the wafer that has a poor splitting property and thus has a low yield in the past can be efficiently divided into each individual chip, so that an improvement in productivity can be achieved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
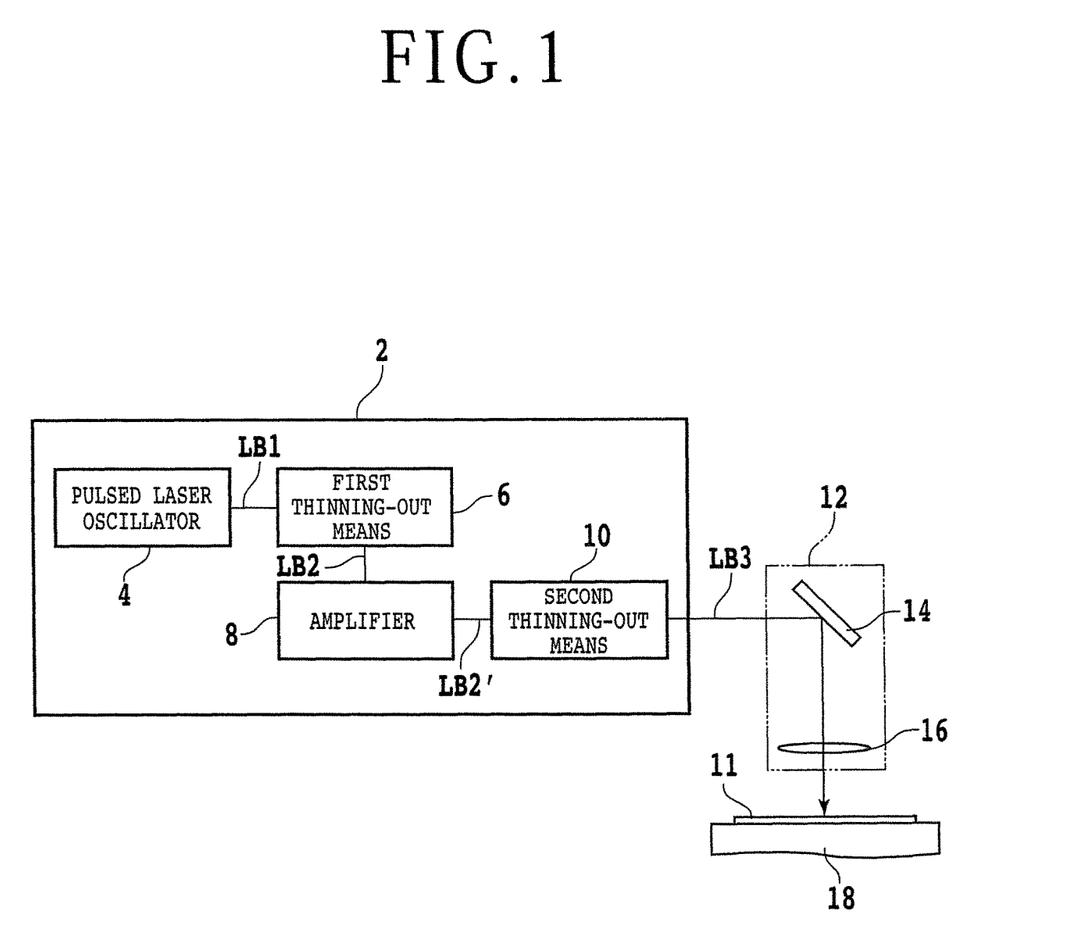
FIG. 1 is a block diagram of a laser beam generating unit that generates a burst pulse laser beam.

An embodiment of the present invention will hereinafter be described in detail with reference to the drawings. FIG. 1 is a block diagram of a burst pulse laser beam generating unit according to the embodiment of the present invention. The burst pulse laser beam generating unit 2 includes a pulsed laser oscillator 4 of YAG, YVO4, or the like. A pulsed laser having a wavelength of 1064 nm or the like, for example, is oscillated from the pulsed laser oscillator 4.

Figure 2A:
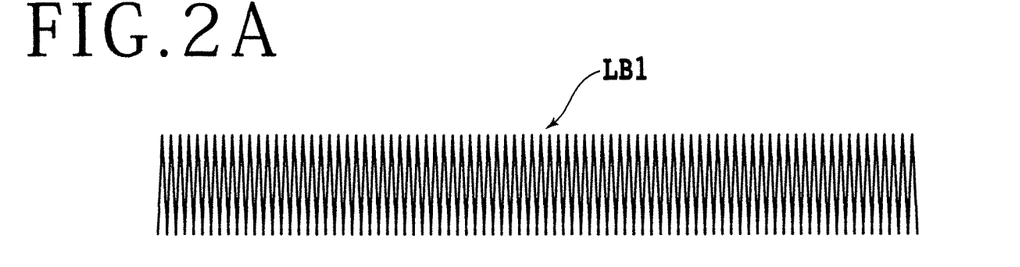
FIG. 2A is a diagram schematically depicting a pulsed laser beam oscillated from a laser oscillator.

The repetition frequency of this pulsed laser is a very high frequency of, for example, a few ten megahertz (MHz) or the like. A pulsed laser beam LB1 emitted from the laser oscillator 4 has a very high repetition frequency, as depicted in FIG. 2A.

Figure 2B:
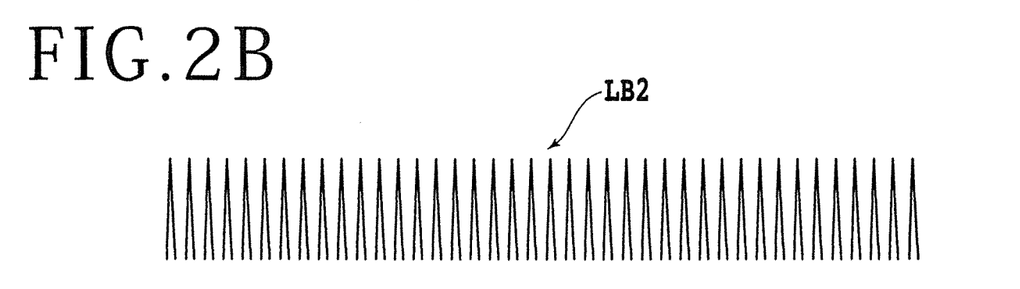
FIG. 2B is a diagram schematically depicting the pulsed laser beam after passing through first thinning-out means.

The pulsed laser beam LB1 is made to enter first thinning-out means 6, is thinned out at predetermined intervals by the first thinning-out means 6, and is consequently converted to a repetition frequency of a few megahertz to 10 MHz, as depicted in FIG. 2B. The first thinning-out means 6 is, for example, configured by shuttering of an acoustooptic modulator (AOM).

Figure 2C:
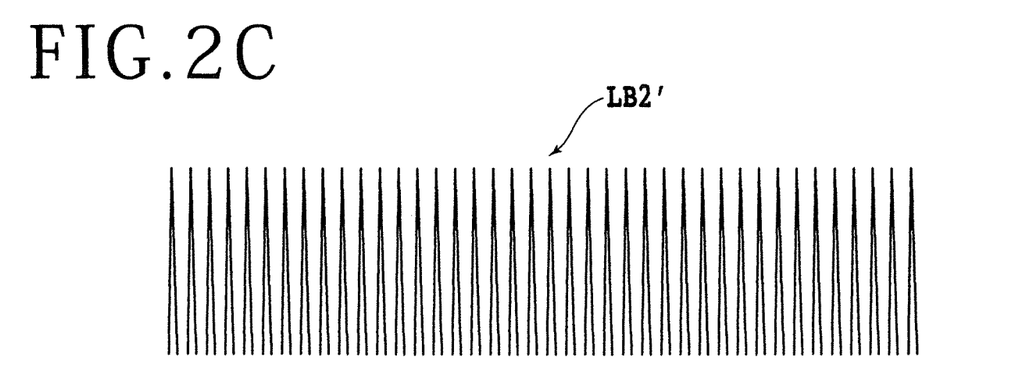
FIG. 2C is a diagram schematically depicting the pulsed laser beam after being amplified by an amplifier.

A pulsed laser beam LB2 emitted from the first thinning-out means 6 is made to enter an amplifier 8, and is amplified by the amplifier 8. An amplified pulsed laser beam LB2' as depicted in FIG. 2C is emitted from the amplifier 8, and is made to enter second thinning-out means 10. The second thinning-out means 10 is also configured by shuttering of an acoustooptic modulator (AOM), for example.

The second thinning-out means 10 thins out the pulsed laser beam LB2' continuously and intermittently at predetermined intervals. A pulsed laser beam LB3 having burst pulses 20 as depicted in FIG. 2D is emitted from the second thinning-out means 10.

Figure 2D:
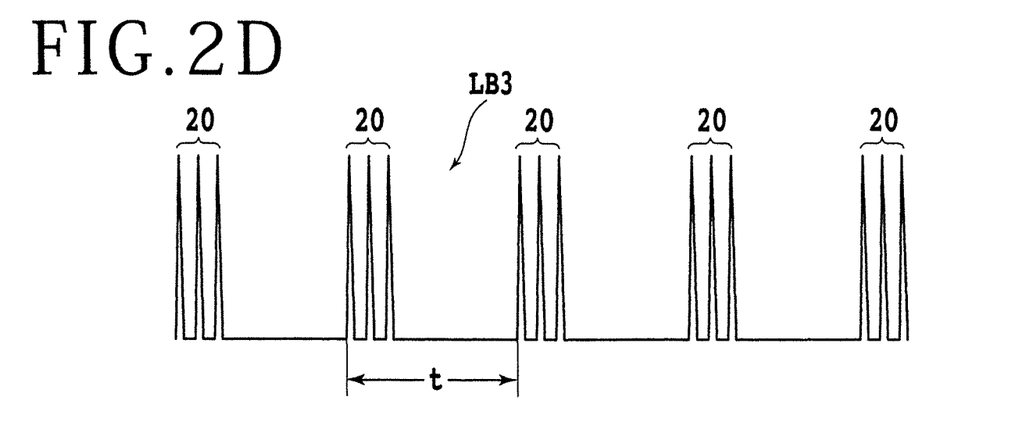
FIG. 2D is a diagram schematically depicting the burst pulse laser beam generated by second thinning-out means.

An interval t between burst pulses 20 adjacent to each other as depicted in FIG. 2D is, for example, 50 to 100 μs. A laser processing method according to the present invention needs to form shield tunnels each constituted of a fine hole and an amorphous region surrounding the fine hole at predetermined intervals. Therefore, a workpiece needs to be irradiated with the burst pulse laser beam LB3 as depicted in FIG. 2D.

The burst pulse laser beam LB3 generated by the second thinning-out means 10 is reflected by a mirror 14 in a condenser 12, and is applied to a substrate 11 held on a chuck table 18 via a condensing lens 16.

The laser processing method according to the present invention is a laser processing method for a wafer in which an epitaxial layer is laminated on a top surface of an epitaxy substrate such as sapphire or the like, and a device such as an optical device or the like is formed in each of regions demarcated by a plurality of intersecting planned dividing lines on a top surface of the epitaxial layer. In the present invention, an experiment was conducted to set time intervals of a plurality of pulses constituting a burst pulse laser beam most suitable for division.

In this experiment, first, a test substrate 11 having a material and a thickness identical to those of the epitaxy substrate of the wafer to be laser-processed was prepared, and the test substrate 11 was sucked and held by the chuck table 18 of a laser processing apparatus, as depicted in FIG. 1 and FIGS. 4A to 4C. In the present embodiment, a sapphire substrate is used as the epitaxy substrate. Thus, the test substrate 11 was also constituted of a sapphire substrate.

The laser processing method according to the embodiment of the present invention first linearly forms a plurality of shield tunnels each constituted of a fine hole and an amorphous region surrounding this fine hole at predetermined intervals within the test substrate 11 by holding the test substrate 11 by the chuck table 18 of the laser processing apparatus, irradiating the test substrate 11 with the burst pulse laser beam LB3 while positioning a condensed region of the burst pulse laser beam LB3 within the test substrate 11, and linearly processing-feeding the chuck table 18, while changing the time intervals of a plurality of pulses constituting the burst pulse laser beam LB3 by the first thinning-out means 6 (shield tunnel forming step).

Here, the terms "the condensed region of the burst pulse laser beam LB3" are used because the condensing lens 16 has a spherical aberration and thus a position at which the burst pulse laser beam LB3 is condensed differs in an optical axis direction of the condensing lens 16 depending on the radial direction position of the burst pulse laser beam LB3 passing through the condensing lens 16. The condensed region extends in the thickness direction of the wafer 11.

Figure 3A:
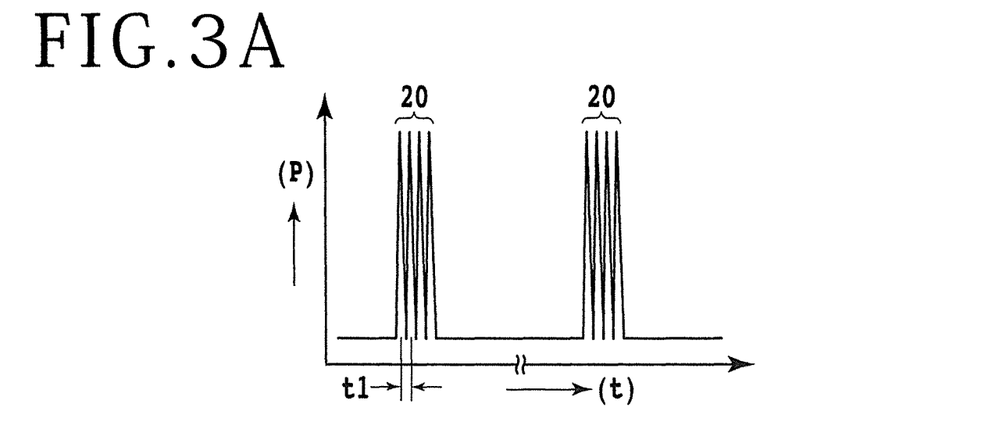
FIG. 3A is a diagram schematically depicting a burst pulse laser beam in which a plurality of pulses constituting burst pulses have small time intervals.

In this shield tunnel forming step, a first test substrate 11 is sucked and held by the chuck table 18, the first test substrate 11 is irradiated with a burst pulse laser beam LB3 having burst pulses 20 with a narrow pulse interval t1 as depicted in FIG. 3A, and thereby one row of shield tunnels is formed within the first test substrate 11.

Figure 3B:
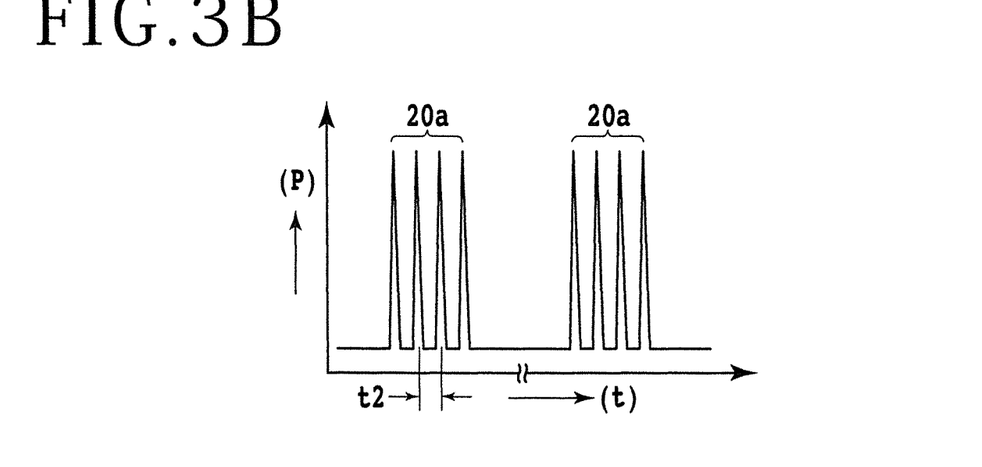
FIG. 3B is a diagram schematically depicting a burst pulse laser beam in which a plurality of pulses constituting burst pulses have medium time intervals.

Next, a second test substrate 11 having an identical material and an identical thickness to those of the first test substrate 11 is sucked and held by the chuck table 18, the second test substrate 11 is irradiated with a burst pulse laser beam LB3 having burst pulses 20a with a pulse interval t2 as depicted in FIG. 3B, and thereby one row of shield tunnels is formed within the second test substrate 11.

Figure 3C:
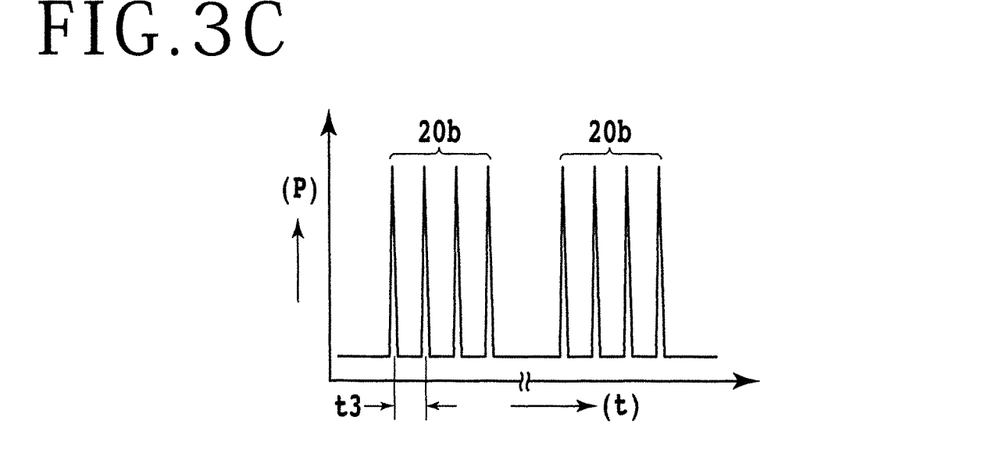
FIG. 3C is a diagram schematically depicting a burst pulse laser beam in which a plurality of pulses constituting burst pulses have large time intervals.

Next, a third test substrate 11 having an identical material and an identical thickness to those of the first test substrate 11 is sucked and held by the chuck table 18, the third test substrate 11 is irradiated with a burst pulse laser beam LB3 having burst pulses 20b with a relatively wide pulse interval t3 as depicted in FIG. 3C, and thereby one row of shield tunnels is formed within the third test substrate 11.

The shield tunnel forming step thus forms one row of shield tunnels in one test substrate 11 while changing the test substrate 11 and while changing the time intervals of the pulses of the applied burst pulse laser beam LB3.

In place of the above-described embodiment, a plurality of rows of shield tunnels separated from each other may be formed by using one test substrate 11 while changing the time intervals of the pulses of the burst pulse laser beam LB3 applied to the test substrate 11.

The shield tunnel forming step will be described in detail with reference to FIGS. 4A to 5B. Preferably, in order to form excellent shield tunnels within the test substrate 11, a value obtained by dividing the numerical aperture (NA) of the condensing lens 16 of the condenser 12 by the index of refraction of the test substrate 11 is set in a range of 0.05 to 0.35.

The index of refraction of sapphire is 1.7, and therefore the numerical aperture (NA) of the condensing lens 16 is preferably set in a range of 0.1 to 0.35. Then, preferably, a condensing lens having a spherical aberration is used as the condensing lens 16. Hence, the test substrate 11 is irradiated with the burst pulse laser beam LB3 in a state in which a vertical aberration occurs in the burst pulse laser beam LB3 condensed by the condensing lens 16.

Figure 4A:
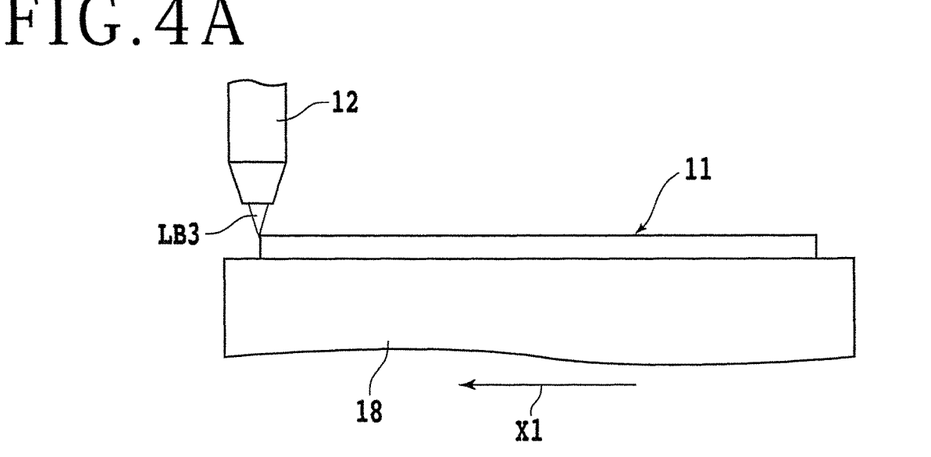
FIG. 4A is a schematic side view depicting a shield tunnel forming step according to an embodiment of the present invention.
Figure 4B:
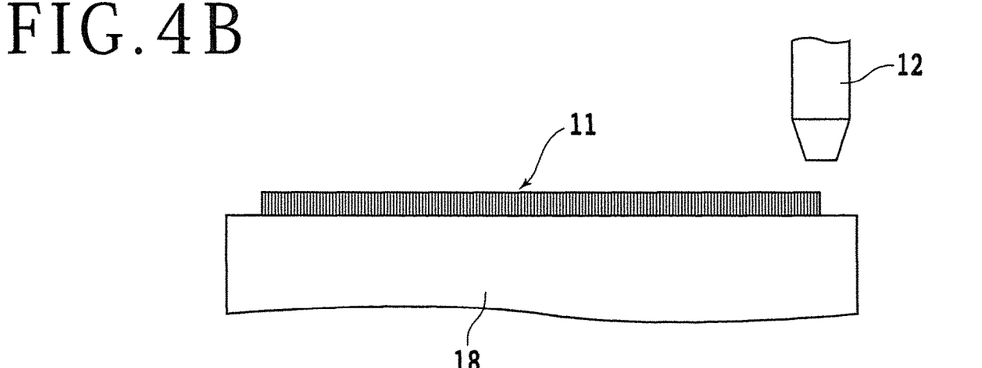
FIG. 4B is a schematic sectional view of a test substrate in a state in which a plurality of shield tunnels are formed within the test substrate.
Figure 4C:
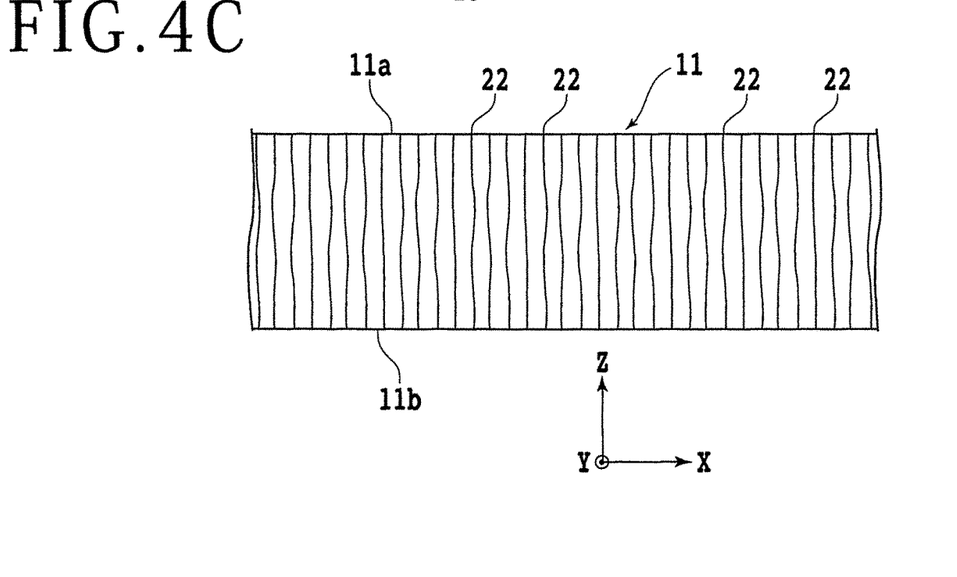
FIG. 4C is a schematic enlarged sectional view of the test substrate in the state in which the plurality of shield tunnels are formed within the test substrate.

In the shield tunnel forming step, as depicted in FIG. 4A, the test substrate 11 is irradiated with the burst pulse laser beam LB3 while the condensed region of the burst pulse laser beam LB3 emitted from the condenser 12 is positioned within the test substrate 11, and the chuck table 18 is processing-fed in the direction of an arrow X1. Consequently, as depicted in FIG. 4B and FIG. 4C, a plurality of shield tunnels 22 are formed linearly (in one row) within the test substrate 11 so as to extend from a top surface 11a to an undersurface 11b of the test substrate 11.

Figure 5A:
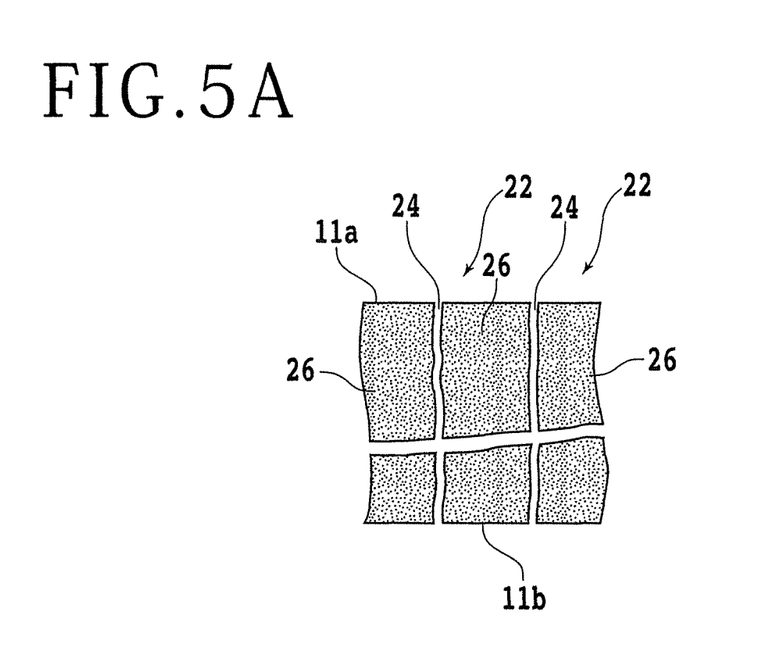
FIG. 5A is a partially broken enlarged sectional view of the test substrate, the view schematically depicting shield tunnels each constituted of a fine hole and an amorphous region.
Figure 5B:
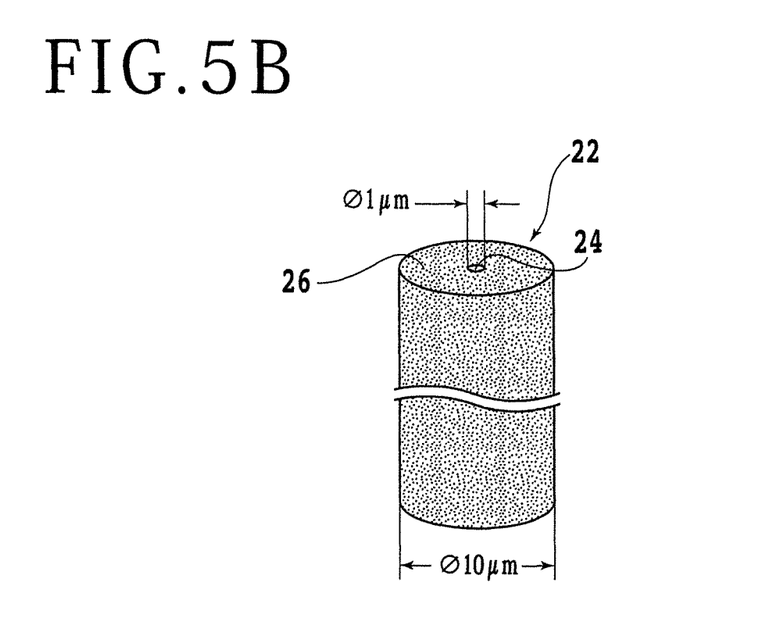
FIG. 5B is a schematic perspective view of one shield tunnel constituted of a fine hole and an amorphous region surrounding the fine hole.

As schematically depicted in FIG. 5A and FIG. 5B, a shield tunnel 22 is constituted of a fine hole 24 formed so as to extend from the top surface 11a to the undersurface 11b of the test substrate 11 and an amorphous region 26 surrounding the fine hole 24.

The diameter of the fine hole 24 is approximately 1 μm. When the repetition frequency of the applied burst pulse laser beam LB3 is set at 10 kHz, and a processing feed speed is set at 100 mm/s, shield tunnels 22 are formed at intervals of approximately 10 μm, as depicted in FIG. 5B, and a crack partly occurs between adjacent fine holes 24.

In the foregoing embodiment, the time intervals of the plurality of pulses constituting the burst pulse laser beam LB3 are changed by the first thinning-out means 6. However, the present invention is not limited to the present embodiment.

As an alternative embodiment, the first thinning-out means 6 may be omitted, and the time intervals of the pulsed laser oscillated by the laser oscillator 4 may be changed. In this case, a plurality of laser oscillators 4 in which the time intervals of oscillated pulses are different are used, a pulsed laser beam LB1 emitted from a laser oscillator 4 is directly made to enter the amplifier 8, and the pulsed laser beam LB1 is amplified.

Figure 6:
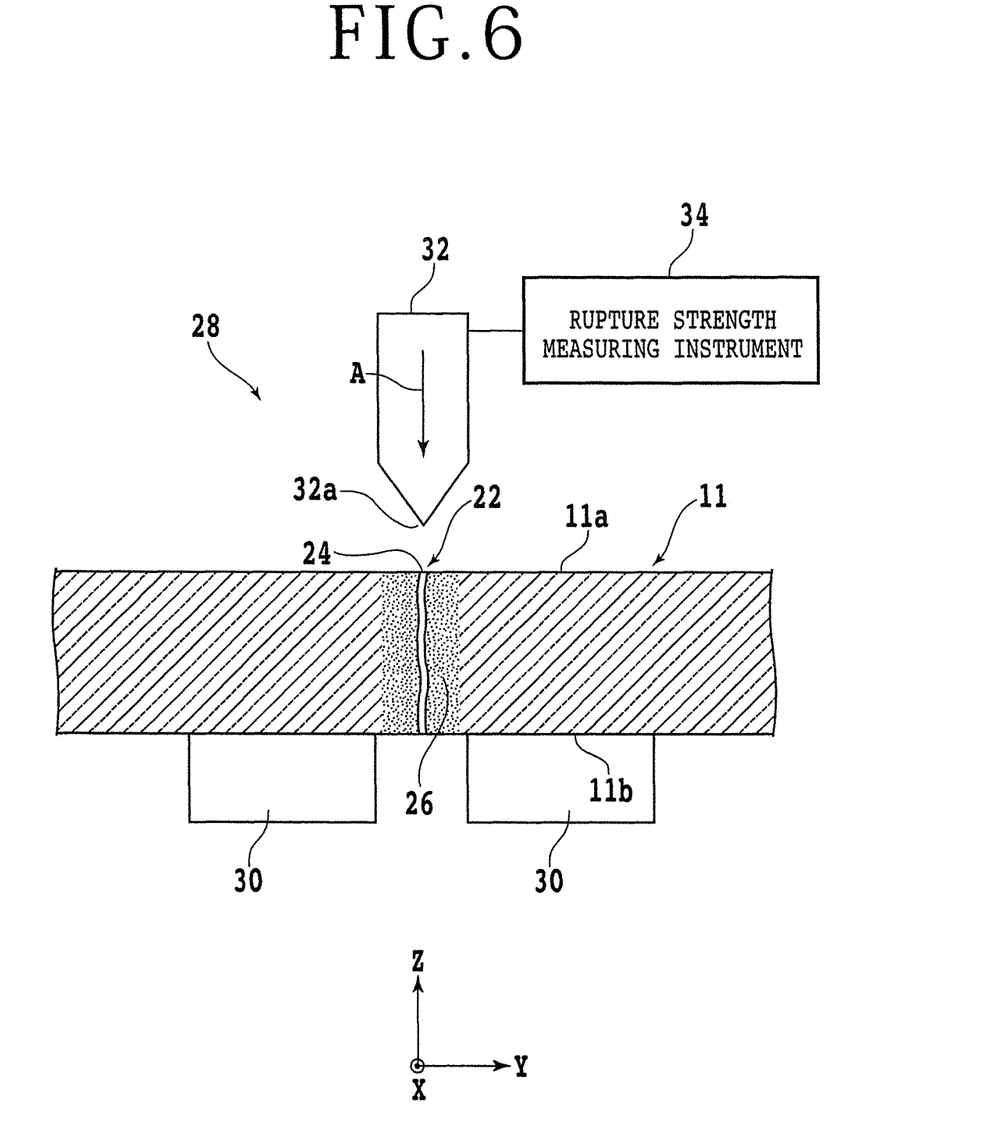
FIG. 6 is a partially sectional side view depicting a rupture strength measuring step.

After the shield tunnel forming step is performed, a rupture strength measuring step is performed which measures a rupture strength when the test substrate 11 is ruptured along the plurality of shield tunnels 22 formed linearly. This rupture strength measuring step is performed by using a dividing jig 28 as depicted in FIG. 6, for example. A wedge member 32 having an acute end 32*a* is pressed against the test substrate 11 while the test substrate 11 is supported by a pair of supports 30 of the dividing jig 28 such that a shield tunnel 22 is midway between the supports 30.

Thus, a bending stress occurs at a part of one row of shield tunnels 22 in a concentrated manner. This bending stress ruptures the test substrate 11 along the plurality of shield tunnels 22. The rupture strength at this time is measured by a rupture strength measuring instrument 34, and is stored in a memory.

One row of shield tunnels 22 is formed in each of the plurality of test substrates 11 while the time intervals of the burst pulses of the burst pulse laser beam LB3 are changed. The above-described rupture strength measuring step is performed for each test substrate 11. The rupture strengths are stored in the memory of the rupture strength measuring instrument 34.

Figure 7:
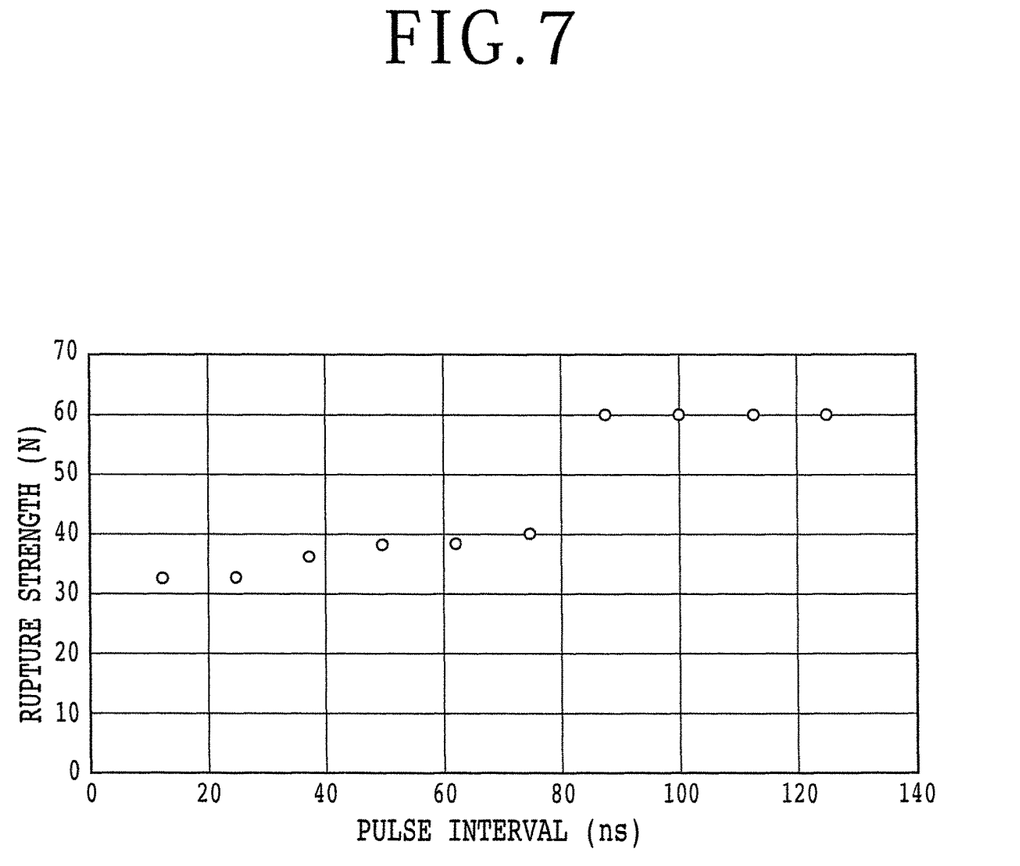
FIG. 7 is a graph depicting relation between the pulse intervals of burst pulses and rupture strength when a sapphire substrate is adopted as the test substrate.
Figure 8:
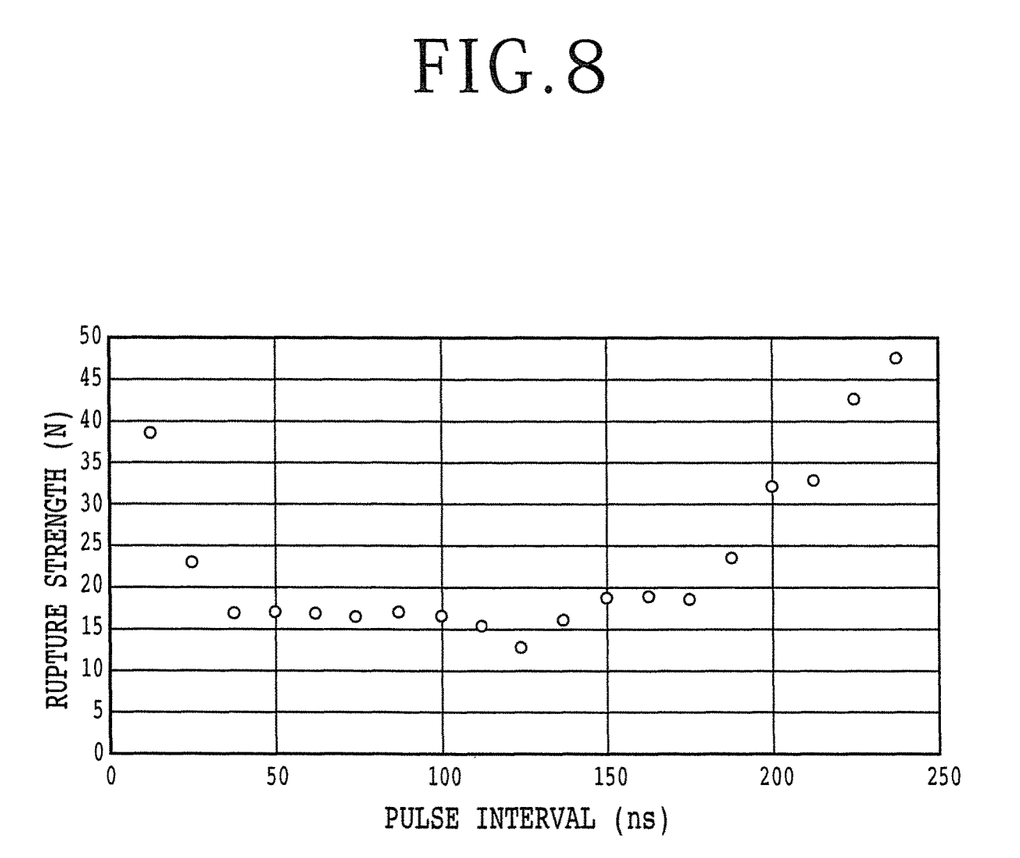
FIG. 8 is a graph depicting relation between the pulse intervals of burst pulses and rupture strength when synthetic silica is adopted as the test substrate.

Then, the rupture strength data stored in the memory is plotted by a controller of the rupture strength measuring instrument 34, and an approximate curve representing relation between the pulse interval (ns) and the rupture strength (N) as depicted in FIG. 7 is generated.

Figure 9:
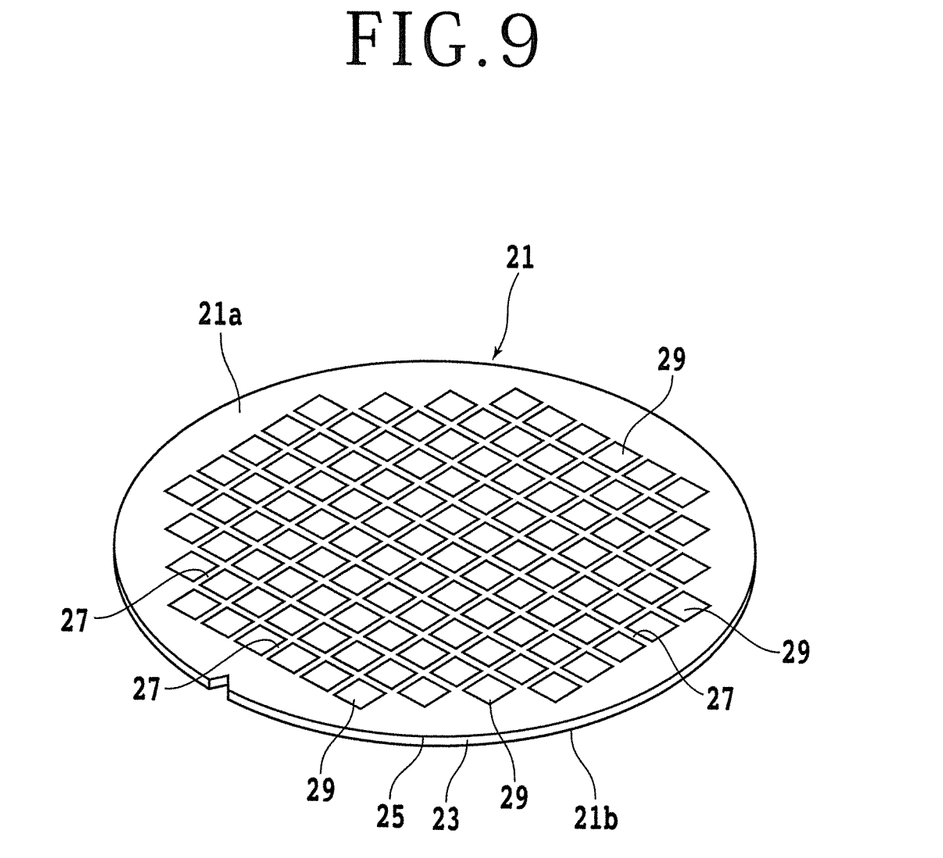
FIG. 9 is a perspective view of an optical device wafer.

FIG. 7 represents a case where the test substrate 11 is formed of a sapphire substrate. It can be calculated from FIG. 7 that a minimum value of the rupture strength of the sapphire substrate 11 is obtained when the pulse interval (ns) is 20 ns. FIG. 9 represents a case where synthetic silica is adopted as the test substrate 11. It can be calculated that the pulse time interval (ns) that minimizes the rupture strength in this case is 125 ns (minimum value calculating step).

Laser processing conditions most suitable when the wafer is laser-processed are calculated by performing the shield tunnel forming step, the rupture strength measuring step, and the minimum value calculating step described above.

That is, in the case where a sapphire substrate is adopted as the test substrate 11, the time interval of each pulse of the burst pulse laser beam LB3 is preferably set to be 20 ns. The time interval of the burst pulse is set by the first thinning-out means 6.

The laser processing conditions of the shield tunnel forming step are set as follows, for example.

Laser oscillator: LD-pumped Q-switch Nd: femtosecond YAG laser or picosecond YAG laser
  Wavelength: 1064 nm
  Average power: 0.3 W
  Repetition frequency of burst pulses: 10 kHz
  Condensed spot diameter: 1 μm
  Processing feed speed: 100 mm/s
  Number of burst pulses: 3

After such optimum laser processing conditions are set, laser processing of an optical device wafer 21 as depicted in FIG. 9, for example, is performed. The optical device wafer 21 is formed by laminating an epitaxial layer 25 of gallium nitride (GaN) or the like onto a sapphire substrate 23.

The sapphire substrate 23 has a thickness of 200 μm, for example. The epitaxial layer 25 has a thickness of 5 μm, for example. The epitaxial layer 25 has a plurality of optical devices 29 such as light emitting diodes (LEDs) or the like formed therein in a state of being demarcated by planned dividing lines 27 formed in a lattice manner.

Next, referring to FIG. 10, description will be made of a laser processing step of laser-processing the optical device wafer 21 under the above-described optimum laser processing conditions. A protective tape 48 is affixed to a top surface 21*a* of the optical device wafer 21 to protect the optical devices 29 formed on the top surface 21*a* of the optical device wafer 21. The protective tape 48 side is held by the chuck table 18 of the laser processing apparatus 40.

Figure 10:
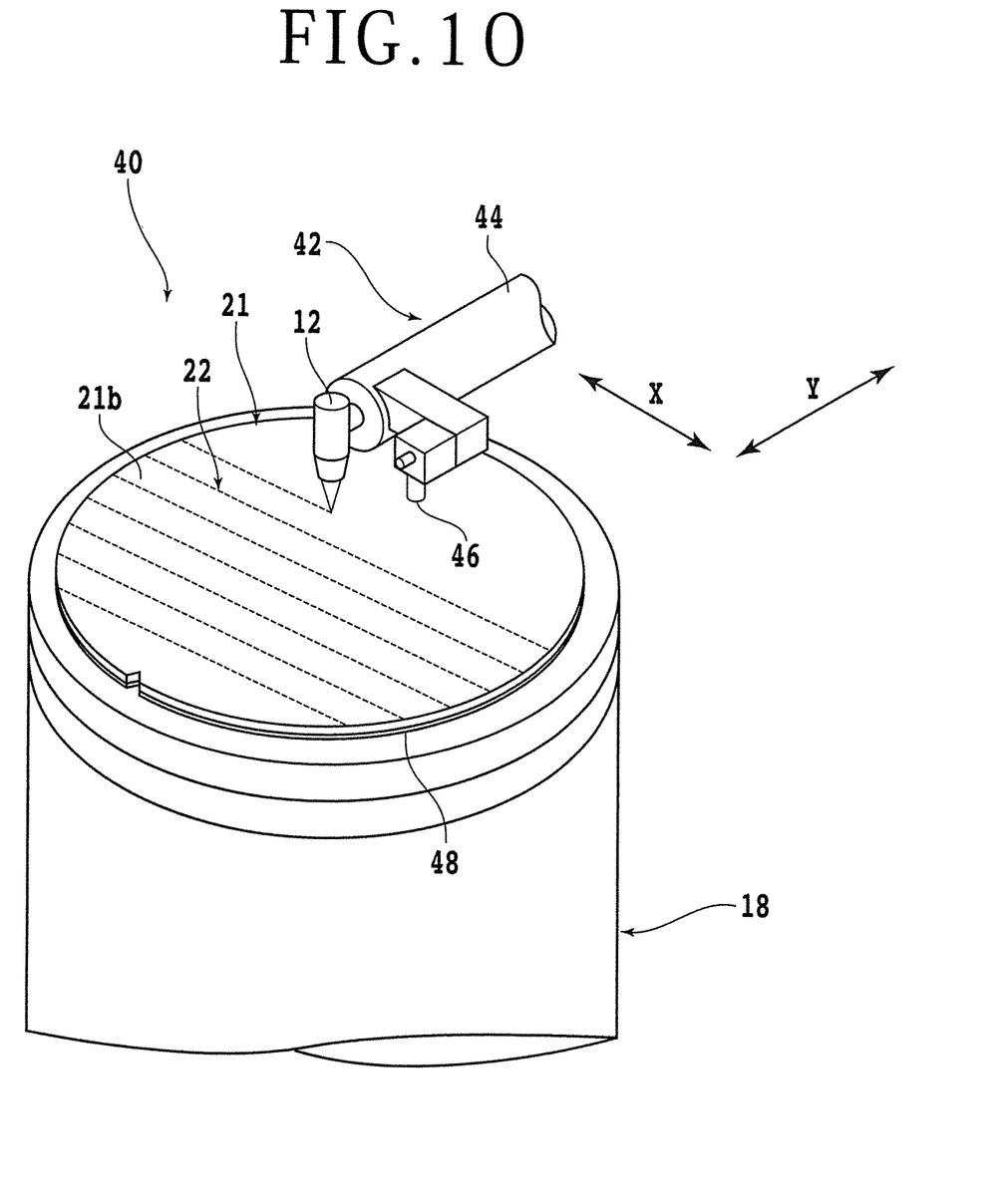
FIG. 10 is a perspective view depicting a laser processing step according to the embodiment of the present invention.

A burst pulse laser beam irradiating unit 42 in FIG. 10 is constituted of the burst pulse laser beam generating unit 2 depicted in FIG. 1, the burst pulse laser beam generating unit 2 being housed in a casing 44 in substantially a cylindrical shape, and the condenser 12 attached to an end of the casing 44.

An imaging unit 46 for performing alignment is attached to the casing 44. The imaging unit 46 includes an ordinary imaging element and an infrared imaging element. The laser processing step according to the present embodiment applies the burst pulse laser beam LB3 from an undersurface 21*b* side of the optical device wafer 21. Therefore, the planned dividing lines 27 are detected by imaging the optical device wafer 21 from the undersurface 21*b* side by the infrared imaging element of the imaging unit 46. An alignment for aligning the planned dividing line 27 and the condenser 12 with each other in an X-axis direction is then performed.

After the alignment is performed, the optical device wafer 21 is irradiated with the burst pulse laser beam LB3 while the condensed region of the burst pulse laser beam LB3 having the pulse time intervals calculated in the minimum value calculating step is positioned in an inner part of the optical device wafer 21 which inner part corresponds to a planned dividing line 27, and the chuck table 18 is processing-fed in the X-axis direction. A plurality of shield tunnels each constituted of a fine hole and an amorphous region surrounding the fine hole are thereby formed in the inner part of the optical device wafer 21 which inner part corresponds to the planned dividing line 27.

The laser processing step is performed which forms shield tunnels along planned dividing lines 27 extending in a first direction while indexing-feeding the chuck table 18 in a Y-axis direction by the pitch of the planned dividing lines 27. Next, the chuck table 18 is rotated by 90°, and then the laser processing step is performed which forms similar shield tunnels along planned dividing lines 27 extending in a second direction.

After the laser processing step is performed along all of the planned dividing lines 27, the optical device wafer 21 is split along the planned dividing lines 27 by using the dividing jig 28 as depicted in FIG. 6, for example. The optical device wafer 21 is divided into each individual device chip by splitting all of the planned dividing lines 27.

The apparatus performing this dividing step is not limited to the dividing jig 28 as depicted in FIG. 6, and a dividing apparatus having an expanding drum as disclosed in Japanese Patent No. 6151557, for example, may be used.

In the foregoing embodiment, description has been made of an example in which an optical device wafer is adopted as a workpiece. However, the laser processing method according to the present invention is not limited to this, but is similarly applicable also to other workpieces such as a silicon wafer, a gallium arsenide wafer, and the like.

In a case where the workpiece is a silicon wafer, the test substrate 11 is constituted of a silicon substrate. In a case where the workpiece is a gallium arsenide wafer, the test substrate 11 is constituted of a gallium arsenide substrate.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method for a wafer in which an epitaxial layer is laminated to a top surface of a substrate, and a device is formed in each of regions demarcated by a plurality of intersecting planned dividing lines on a top surface of the epitaxial layer, the laser processing method comprising:
    a pulse thinning-out step of thinning out pulses of a pulsed laser beam of a wavelength transmissible through the wafer, the pulsed laser beam being oscillated from a laser oscillator, by first thinning-out means at first predetermined intervals;
    an amplifying step of amplifying the pulsed laser beam after the pulse thinning-out step is performed;
    a burst pulse laser beam generating step of generating a burst pulse laser beam by continuously and intermittently thinning out the pulsed laser beam amplified in the amplifying step by second thinning-out means at second predetermined intervals;
    a test substrate preparing step of preparing a test substrate having a material and a thickness identical to a material and a thickness of the substrate of the wafer;
    a shield tunnel forming step of linearly forming a plurality of shield tunnels each constituted of a fine hole and an amorphous region surrounding the fine hole at predetermined intervals within the test substrate by holding the test substrate by a chuck table of a laser processing apparatus, irradiating the test substrate with the burst pulse laser beam while positioning a condensed region of the burst pulse laser beam within the test substrate, and processing-feeding the chuck table, while changing time intervals of a plurality of pulses constituting the burst pulse laser beam;
    a rupture strength measuring step of measuring a rupture strength when the test substrate is ruptured along the plurality of shield tunnels after the shield tunnel forming step is performed;
    a minimum value calculating step of calculating the time intervals of the pulses that minimize the rupture strength of the test substrate after the rupture strength measuring step is performed a plurality of times while changing the time intervals of the plurality of pulses constituting the burst pulse laser beam; and
    a laser processing step of linearly forming a plurality of shield tunnels each constituted of a fine hole and an amorphous region surrounding the fine hole at predetermined intervals in an inner part of the wafer, the inner part corresponding to a planned dividing line, by holding the wafer by the chuck table of the laser processing apparatus, irradiating the wafer with the burst pulse laser beam while positioning the condensed region of the burst pulse laser beam having the calculated time intervals of the pulses, the calculated time intervals being calculated in the minimum value calculating step, in the inner part of the wafer, the inner part corresponding to the planned dividing line, and processing-feeding the chuck table, after the minimum value calculating step is performed.

2. A laser processing method for a wafer in which an epitaxial layer is laminated to a top surface of a substrate, and a device is formed in each of regions demarcated by a plurality of intersecting planned dividing lines on a top surface of the epitaxial layer, the laser processing method comprising:
    an amplifying step of amplifying a pulsed laser beam of a wavelength transmissible through the wafer, the pulsed laser beam being oscillated from a laser oscillator;
    a burst pulse laser beam generating step of generating a burst pulse laser beam by continuously and intermittently thinning out the pulsed laser beam amplified in the amplifying step by thinning-out means at predetermined intervals;
    a test substrate preparing step of preparing a test substrate having a material and a thickness identical to a material and a thickness of the substrate of the wafer;
    a shield tunnel forming step of linearly forming a plurality of shield tunnels each constituted of a fine hole and an amorphous region surrounding the fine hole at predetermined intervals within the test substrate by holding the test substrate by a chuck table of a laser processing apparatus, irradiating the test substrate with the burst pulse laser beam while positioning a condensed region of the burst pulse laser beam within the test substrate, and processing-feeding the chuck table;
    a rupture strength measuring step of measuring a rupture strength when the test substrate is ruptured along the plurality of shield tunnels after the shield tunnel forming step is performed;
    a minimum value calculating step of, after the rupture strength measuring step is performed a plurality of times while changing time intervals of a plurality of pulses constituting the burst pulse laser beam, calculating the time intervals of the pulses that minimize the rupture strength of the test substrate; and
    a laser processing step of linearly forming a plurality of shield tunnels each constituted of a fine hole and an amorphous region surrounding the fine hole at predetermined intervals in an inner part of the wafer, the inner part corresponding to a planned dividing line, by holding the wafer by the chuck table of the laser processing apparatus, irradiating the wafer with the burst pulse laser beam while positioning the condensed region of the burst pulse laser beam in the inner part of the wafer, the inner part corresponding to the planned dividing line, using the laser oscillator oscillating pulses having the time intervals calculated in the minimum value calculating step, and processing-feeding the chuck table, after the minimum value calculating step is performed.

* * * * *